US010333476B2

(12) United States Patent
Imai et al.

(10) Patent No.: US 10,333,476 B2
(45) Date of Patent: Jun. 25, 2019

(54) ELECTRIC POWER CONVERTER AND POWER AMPLIFIER

(71) Applicants: IKS CO., LTD., Kyoto (JP); JGC CORPORATION, Kanagawa (JP)

(72) Inventors: Takashi Imai, Kyoto (JP); Hiroaki Hasegawa, Kanagawa (JP); Nobuo Kakizaki, Kanagawa (JP); Kazutaka Hiraoka, Kanagawa (JP); Shinji Takahashi, Kanagawa (JP)

(73) Assignees: IKS CO., LTD., Kyoto (JP); JGC CORPORATION, Kanagawa (JP)

( * ) Notice: Subject to any disclaimer, the term of this patent is extended or adjusted under 35 U.S.C. 154(b) by 0 days.

(21) Appl. No.: 15/499,097

(22) Filed: Apr. 27, 2017

(65) Prior Publication Data

US 2017/0230016 A1    Aug. 10, 2017

Related U.S. Application Data

(63) Continuation of application No. PCT/JP2015/080631, filed on Oct. 26, 2015.

(30) Foreign Application Priority Data

Oct. 29, 2014  (JP) .................................. 2014-220147

(51) Int. Cl.
*H03F 3/217* (2006.01)
*H02M 3/158* (2006.01)
*H02M 3/156* (2006.01)

(52) U.S. Cl.
CPC ............ *H03F 3/217* (2013.01); *H02M 3/156* (2013.01); *H02M 3/158* (2013.01); *H03F 3/2171* (2013.01);

(Continued)

(58) Field of Classification Search
CPC .... H03F 1/0211; H03F 1/0227; H03F 1/0244; H03F 1/305; H03F 3/04; H03F 2200/504;

(Continued)

(56) References Cited

U.S. PATENT DOCUMENTS 6,100,675 A    8/2000  Sudo
7,002,815 B2 *  2/2006  Scarlatescu ......... H02M 1/4225
                                                       363/34

(Continued)

FOREIGN PATENT DOCUMENTS

CN    1220515 A    6/1999
JP    11155281 A   6/1999

(Continued)

OTHER PUBLICATIONS

International Search Report issued for International Patent Application No. PCT/JP2015/080631 dated Feb. 2, 2016.

(Continued)

*Primary Examiner* — Khanh V Nguyen
(74) *Attorney, Agent, or Firm* — Myers Wolin, LLC

(57) ABSTRACT

An electric power converter includes a first capacitor being located between an input terminal and an output terminal, and that connects a first terminal being located between the input terminal and a ground, a reactor that connects through electric contact between the first terminal and the output terminal, a switching element that connects through electric contact between the input terminal and the output terminal, and a control unit that executes a first PWM control process controlling a pulse width of the PWM waveform by on and off of the switching device according to the fluctuation of the output voltage, and that executes a second PWM control process widening a pulse width of the PWM and a duty cycle of a PWM than those of the previous cycle when a pulse width becomes a lower limit.

7 Claims, 12 Drawing Sheets

(52) U.S. Cl.
CPC ...... *H03F 3/2173* (2013.01); *H03F 2200/108* (2013.01); *H03F 2200/351* (2013.01)

(58) Field of Classification Search
CPC .. H03F 2200/507; H03F 3/217; H03F 3/2171; H03F 3/2173; H03F 2200/432; H03G 3/004; H03G 3/3042; H02M 3/158
USPC ................................ 330/10, 207 A, 251, 297
See application file for complete search history.

(56) References Cited

U.S. PATENT DOCUMENTS

| | | | | |
|---|---|---|---|---|
| 7,719,246 | B2* | 5/2010 | Melanson | H02M 1/4225 323/282 |
| 8,310,313 | B2* | 11/2012 | Guo | H03F 1/0244 330/207 P |
| 9,112,412 | B2* | 8/2015 | Shoji | H02M 7/53871 |
| 9,379,611 | B2* | 6/2016 | Zhao | H02M 3/158 |
| 9,419,509 | B2* | 8/2016 | Jarvinen | H02M 1/084 |
| 2005/0036340 | A1* | 2/2005 | Scarlatescu | H02M 1/4225 363/34 |
| 2011/0316503 | A1* | 12/2011 | Huang | H02J 1/102 323/271 |
| 2012/0099348 | A1* | 4/2012 | Umetani | H02M 3/158 363/37 |
| 2015/0008890 | A1* | 1/2015 | Sasao | H02M 1/08 323/271 |
| 2015/0115926 | A1* | 4/2015 | Song | H02M 3/158 323/290 |
| 2015/0364996 | A1* | 12/2015 | Mansri | H02M 3/158 323/271 |

FOREIGN PATENT DOCUMENTS

| | | |
|---|---|---|
| JP | 2000324852 A | 11/2000 |
| JP | 2005160224 A | 6/2005 |
| TW | 425753 B | 3/2001 |

OTHER PUBLICATIONS

First Office Action issued by the Canadian Intellectual Property Office (CIPO) dated Mar. 28, 2018, for corresponding Canada application No. 2,966,112.

* cited by examiner

ELECTRIC POWER CONVERTER AND POWER AMPLIFIER

CROSS-REFERENCE TO RELATED APPLICATION

This application is a continuation application of International Application PCT/JP2015/080631, filed on Oct. 26, 2015, which claims priority to Japanese Patent Application No. 2014-220147, filed on Oct. 29, 2014, the entire contents of each of which is incorporated herein by reference.

TECHNICAL FIELD

The embodiment discussed herein relates to an electric power converter that controls pulse width modulation.

BACKGROUND ART

The electric power converter converts power into the predefined power by creating electromagnetic induction by switching on and off in a coil. The PWM (pulse width modulation) is utilized for the electric power conversion of the electric power converter. For example, in case that the converter enlarges the output power, the on time width is set to be long, in case that the converter lowers the output power, the on time width is set to be short.

However, when the input power becomes low, the inductive voltage or the inductive current is not induced. Therefore, the predetermined output power is not created. Therefore, the control device discloses in which, when the input power becomes low, the control device switches the big power conditioner to the small power conditioner to keep the inductive current normal (Patent Document 1).

Patent Document 1: Japanese Laid-open Patent Publication No. 2009-225489.

However, when the power conditioner is switched by the input power, the power conditioner is activated or deactivated by the fluctuation of input power, and thereby, the behavior of power conditioner is possible to become unstable.

To solve the above problem, according to an aspect of the invention, the object of an aspect of the embodiment to provide an electric power converter that sets the minimum value of pulse width at the value (for example, 30%) that causes the power converter inefficient, and shorter the period to set the power of power converter at the power that is higher than the power of one PWM output, thereby, do not cause the efficiency power converter lowering.

SUMMARY

To solve the above problem, according to an aspect of the invention, an electric power converter including:

a first capacitor being located between an input terminal and an output terminal, and that connects a first terminal being located between an input terminal and a ground; a reactor that connects through electric contact between the first terminal and the output terminal; a switching element that connects through electric contact between the input terminal and the output terminal; and a control unit that executes a first PWM control process controlling a pulse width of the PWM waveform by on and off of the switching device according to the fluctuation of the output voltage, and that executes a second PWM control process widening pulse width of PWM and duty cycle of PWM than those of previous cycle when the pulse width becomes a lower limit.

In another embodiment as a concrete configuration, the control unit multiplies the pulse width of PWM and the period of PWM by N (N means plus quantity greater than one) times.

Also, in another embodiment as a concrete configuration, the reactor is connected to the input terminal at one end; the switching element is connected to the other terminal of the reactor at one end; the switching element is connected to a ground at the other end; the electric power comprising: a rectifying element that connects through electric contact between the other end of reactor and the output terminal; and a second capacitor that connects through one end between the output terminal and the rectifying element and that connects through other end to a ground.

Further, in another embodiment as a concrete configuration, the electric power converter including: a rectifying element; and a second capacitor that connects through one end between the output terminal and the reactor and that connects through the other end to a ground; wherein the switching element connects to through electric contact between the input terminal and one end of the reactor; and the rectifying element connects through one end to the reactor and through other end to a ground.

Also, in another embodiment as a concrete configuration, the switching element includes silicon carbide (SiC) element.

Further, in another embodiment as a concrete configuration, an electric power converter including: a DC power source; a first circuit that includes one first and second switching elements being connected in series, and connects the DC power source; a second circuit that includes third and fourth switching elements being connected in series, and connects the DC power source; a first reactor that connects through electric contact between a connecting mid-point of the first circuit and an output terminal of the first circuit; a second reactor that connects through electric contact between a connecting mid-point of the second circuit and an output terminal of the second circuit; a control unit that executes a first PWM (Pulse Width Modulation) control process alternately turning on the half cycle of alternating signal to be outputted to the first switching element and third switching element, and controlling the PWM pulse wave in PWM wave of the second switching element and fourth switching element, and that executes a second PWM control process widening the pulse width of PWM and prolonging widening the period of PWM than those of previous cycle when the pulse width becomes a lower limit.

Also, in another embodiment as a concrete configuration, a power amplifier comprising: a first and second AC power source input terminal that AC power source is inputted; a first circuit that includes one first and second switching elements being connected in series, and connects the DC power source; a second circuit that includes third and fourth switching elements being connected in series, and connects the DC power source; a first reactor that connects through electric contact between a connecting mid-point of the first circuit and the first AC power source input terminal; a second reactor that connects through electric contact between a connecting mid-point of the second circuit and the second AC power source input terminal; a control unit that executes a first PWM (Pulse Width Modulation) control process alternately turning on the half cycle of alternating signal to be outputted to the first switching element and third switching element, and controlling the PWM pulse wave in PWM wave of the second switching element and fourth switching element, and that executes a second PWM control process widening the pulse width of PWM and prolonging widening the period of PWM than those of previous cycle when the pulse width becomes a lower limit.

According to the invention, the minimum value of pulse width is set at the value (for example, 30%) that causes the power conditioner inefficient, and when the output is lower that the minimum value, the period is shortened to set the power of power conditioner at the power that is higher than the power of one PWM output, in order not to decrease efficiency of power converter, thereby, do not cause the efficiency power conditioner lowering.

DETAILED DESCRIPTION

Figure 1:
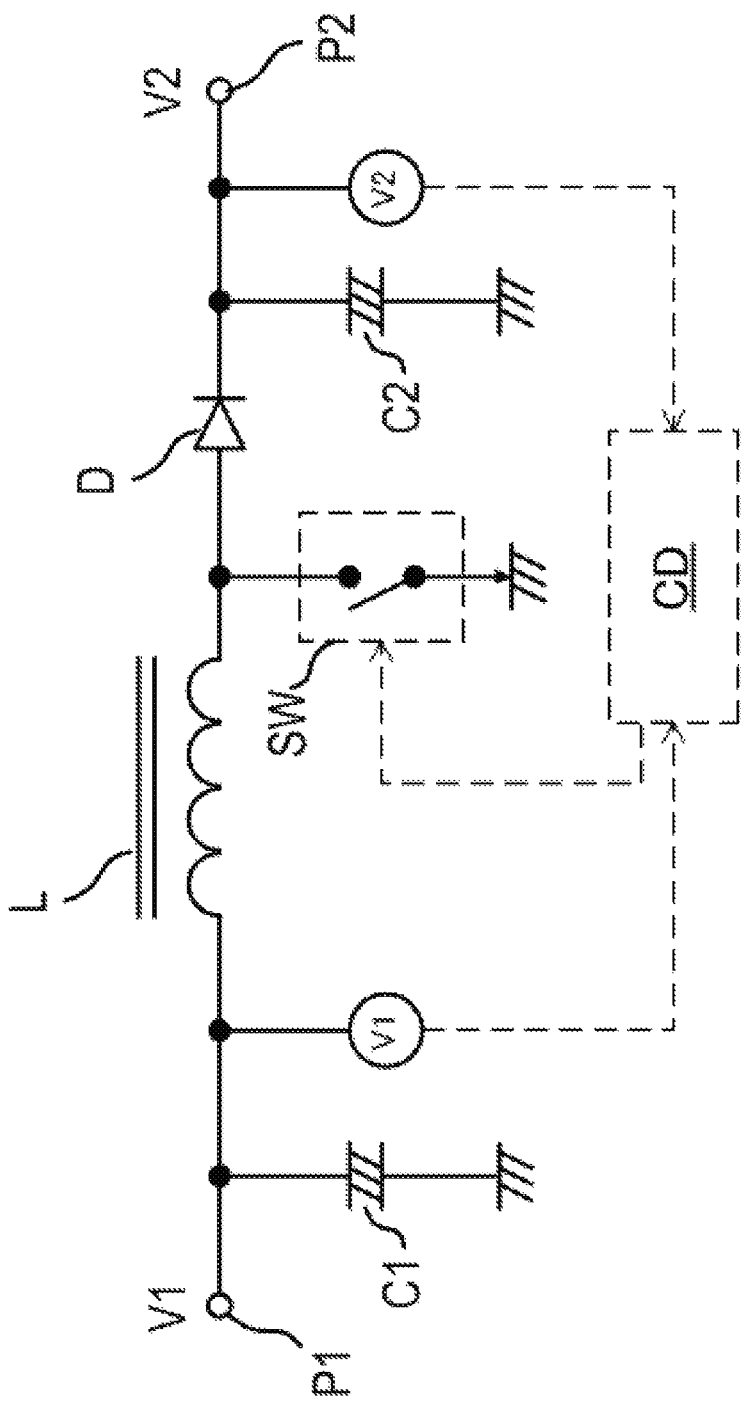
FIG. 1 illustrates a diagram of direct current to direct current power converter according to an embodiment of the invention.

The present invention will become clearer from the following descriptions. FIG. 1 illustrates a schematic circuit diagram of a direct current to direct current power converter according to an embodiment of the invention.

In FIG. 1, the DC/DC converter according to the embodiment includes an input terminal P1 that an input direct current V1 is inputted, an output terminal P2 that an output direct current V2 is outputted, an diode D whose negative electrode is connected to the output terminal P2, a capacitor C1 that connects through electric contact between the first terminal P1 and a ground, a reactor L that connects the first terminal P1 at one end and a positive electrode of the diode D at the other end, a capacitor C2 that connects through electric contact between the output terminal P2 and the ground, a voltmeter V1m that detects the voltage V1 inputted to the input terminal P1, a switch SW that connects through electric contact between the ground and the electric connecting point of the reactor L and the diode D, and a control unit CD that capture the voltages from the input voltmeter V1 and the output voltmeter V2, and that controls the operation of switch SW and the pulse width according to the output power V2.

The control unit CD executes a PWM control as the following two control methods.

1. First PWM Control

Figure 11:
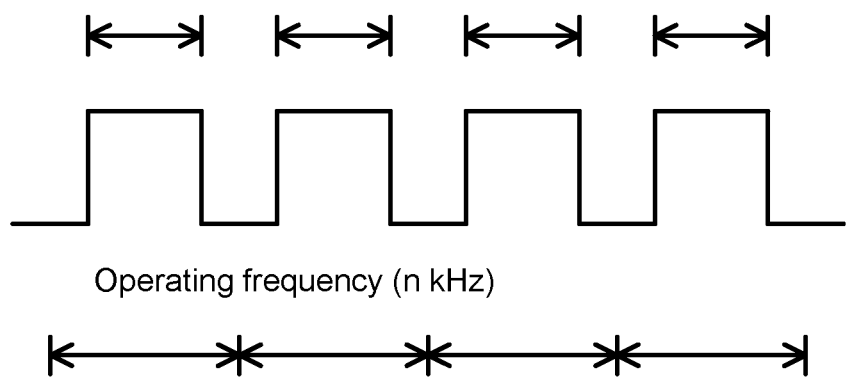
FIG. 11 illustrates the waveform of PWM when maximum output of prior direct current to direct current power converter is 100%.
Figure 12:
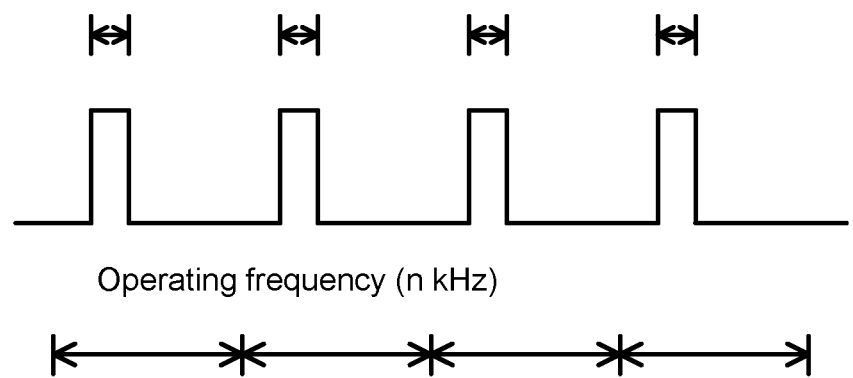
FIG. 12 illustrates the waveform of PWM when low power output of prior direct current to direct current power converter is 100%.

In the first PWM control, when the control unit CD increases the output power, the control unit CD widens the "on" time width as illustrated in FIG. 11. On the contrary, when the control unit CD decreases the output power, the control unit CD narrows the "on" time width. FIG. 12 illustrates that the pulse width is 10%.

2. Second PWM Control

In the second PWM control, the control unit controls the pulse width at the predetermined output power when the efficiency does not decrease, and widens the pulse width of PWM and widens the period of PWM than those of previous cycle when the output power is below the predetermined output power.

In the first PWM control, when the output power decreases and the "on" time width narrows, the efficiency of the power converter decreases by the switching losses. Therefore, in the second PWM control, the pulse width of PWM is widened and the period of PWM is widened in order not to decrease the efficiency of power converter, and thereby, the efficiency of the power converter can increase.

Therefore, from the high load power to low load power, the power converter can convert power stably, and has an effect to provide with the high efficiency, more stable direct current to direct current power converter.

Figure 10:
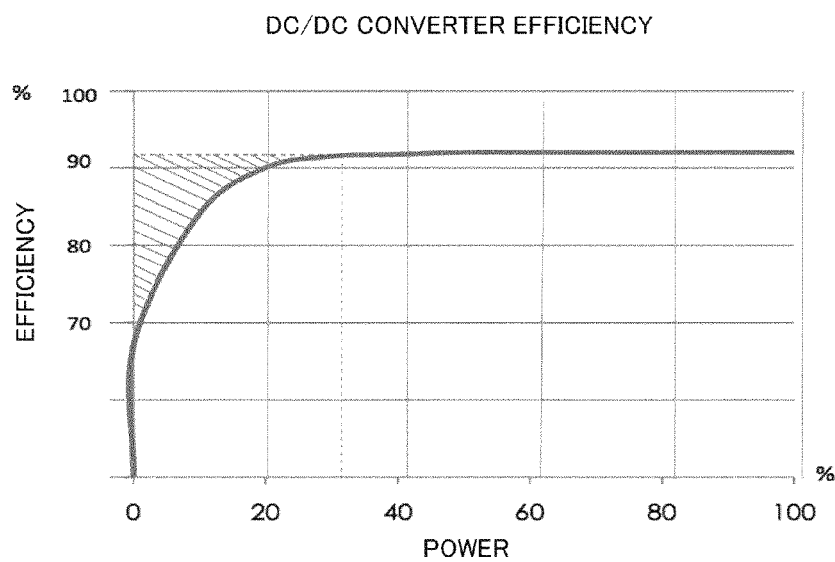
FIG. 10 illustrates the chart of the efficiency of prior direct current to direct current power converter.

Further, in this embodiment, the efficiency of output power from 0% to 100% is illustrated in FIG. 10. By the 30% of pulse width, the efficiency of power converter is stable, and therefore the period (1/n, when the frequency is n) of PWM is a constant value. However, when the pulse width becomes narrower than 30%, the control unit CD controls to switch on and off switch SW. More specifically, the control unit CD multiplies the period of PWM by n times (for example, three times) and the pulse width of PWM by n times (for example, when the pulse width is 10%, the pulse width increase three times).

Figure 2:
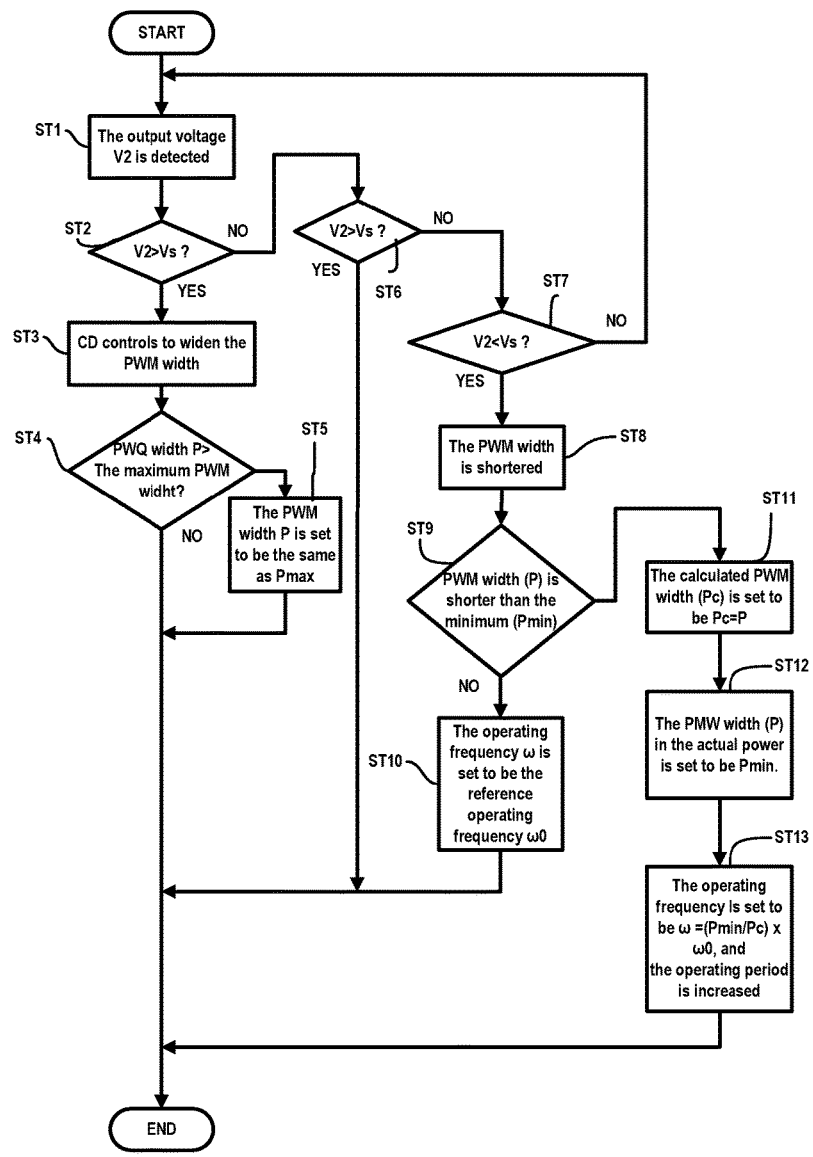
FIG. 2 illustrates a control flowchart of operation of direct current to direct current power converter according to an embodiment of the invention.

Next, the operation process in accordance with each output of pulse width modulation in DC/DC power converter according to the above embodiment is explained by reference to the flow illustrated in FIG. 2.

After the operation is started, the output voltage V2 is detected. The detected output voltage V2 is stored in memory unit of control unit CD. The next step ST2 is proceeded. In the step ST2, it is decided whether the output voltage V2 is larger than the predetermined voltage VS. After the decision process, when the output voltage V2 is larger than the predetermined voltage VS, that is yes, the process proceeds with the next step ST3. On the other hand, when the output voltage V2 is not larger than the predetermined voltage VS, that is no, the process proceeds with the step ST6.

In the step ST3, since the output voltage V2 is not larger than the predetermined voltage VS, the control unit CD controls to widen the PWM width, and input it to switch SW. Next, the process proceeds with the step ST4.

In the step ST4, it is decided whether the PWM width P is wider than the maximum PWM width (Pmax, for example 100%). When PWM width P is not wider than the maximum PWM width (Pmax), the decision is "no" and the process ends. On the other hand, when PWM width P is wider than the maximum PWM width (Pmax), the decision is "yes" and the process proceeds with step ST5. The PWM width P is set to be the same as Pmax, and the process ends.

Next, by the decision no about the decision whether or not V2 is larger than VS in the step ST2, it is decided whether the output voltage is equal to the predetermined voltage VS in step ST6. In the step ST6, when the output voltage is equal to the predetermined voltage VS, the decision is "Yes", and it is not necessary to increase or decrease the output voltage V2, and therefore, the process ends. On the other hand, when the output voltage is not equal to the predetermined voltage VS, the decision is no, and the process proceeds with the step ST7.

In step ST7, it is decided whether the output voltage V2 is smaller than predetermined output voltage VS. In this step ST7. When the output voltage V2 is smaller than the predetermined output voltage VS, the process proceeds with the step ST8. On the other hand, when the decision is no in step ST7, the process returns to the step ST1.

In the step ST8, the PWM width is shortened. Next, then process proceeds with the step ST9. In the step ST9, It is determined whether or not the PWM width (P) is more than the minimum (Pmin). The minimum (Pmin) corresponds to the output P in which the efficiency is decreasing under 30% in case that the PWM width is set under 100%. Therefore, in the step ST9, it is determined whether or not the PWM width (P) is the minimum (Pmin). For example, Pmin is 30% of pulse width.

When, in the step ST8, the PWM width is shortened, for example, to equalize it to Pmin which is 30% of pulse width, it is determined whether or not the PWM width (P) is shorter than the minimum (Pmin) in the step ST9, and the determination becomes "No" and the process proceeds with step ST10. In the step ST10, the operating frequency ω is set to be the reference operating frequency ω0, and the process returns to the step ST1. The above steps ST9, ST10, when the PWM width is more than 30% of pulse width, the process is the same as above.

On the contrary, when the PWM width (P) is shorter than the minimum (Pmin, for example, it is 30% of pulse width) in the step ST8, the determination whether or not the PWM width (P) is shorter than the minimum (Pmin) in the step ST9 is Yes and the process proceeds with step ST11. Next, in the step ST11, the calculated PWM width (Pc) is calculated as P. The Pc corresponds to the minimum Pmin (for example, 30% of pulse width), and the PWM width shown in FIG. 5 multiplies by three.

Next, the process proceeds with step ST12. In the step ST12, the PWM width (P) in the actual power is set to be Pmin. The PWM width set at this step depends on the efficiency characteristic of the electric power converter. In the efficiency characteristic illustrated in FIG. 5, the original 10% of pulse width is set to be 30% of pulse width, and the process proceeds with step ST13.

Figure 5:
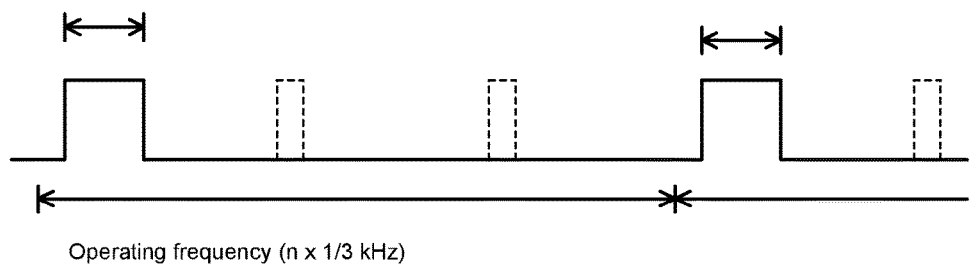
FIG. 5 illustrates a chart of the waveform in the PWM of direct current to direct current power converter when the period of PWM is set to be three time period of previous cycle according to the embodiment of the invention.

In the step ST13, ω0 is the reference operating frequency, Pmin is the PWM width in which the efficiency starts to decrease, Pc is the PWM width for output calculation, and the operating frequency ω is decreased and the operating period is increased by the calculation equation of ω=(Pmin/Pc)×ω0. As illustrated in FIG. 5, the operating frequency ω is decreased, the pulse width is increased from 10% to 30% and operating period is set to be three times, and thereby preventing efficiency in low output from decreasing.

Figure 4:
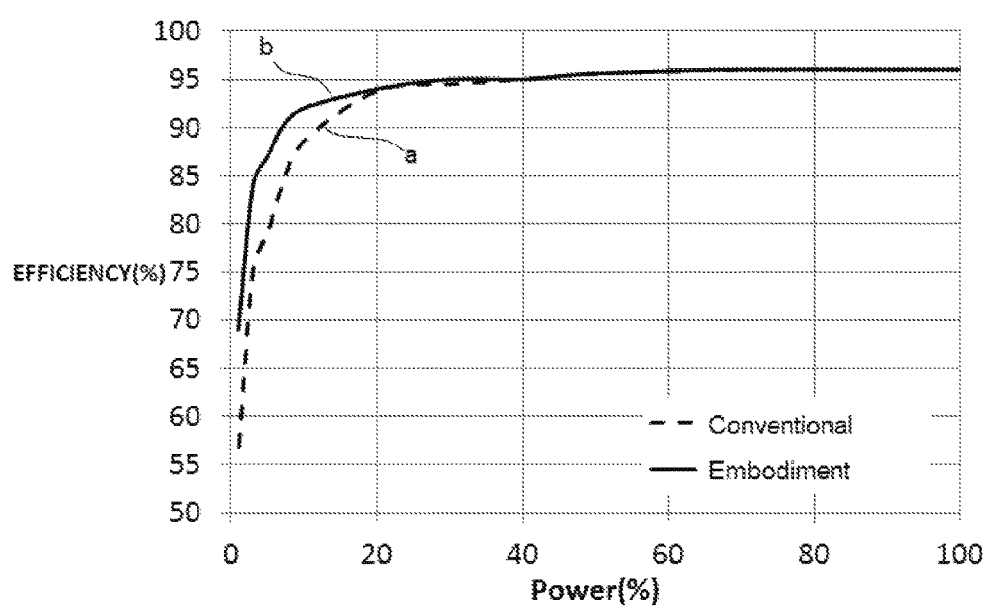
FIG. 4 illustrates a chart of an efficiency of direct current to direct current power converter according to the embodiment of the invention.

Further, the inventors of this application conducted an experiment using a DC/DC electric power converter illustrated in FIG. 1, a conventional electric power converter. As illustrated in FIG. 4, the load characteristics a between power and efficiency in the conventional circuit were obtained on the conditions of the frequency of 15 kHz, and pulse band width changing from 10% to 100% of pulse width, the load characteristics b between power and efficiency in the conventional circuit were obtained on the conditions of the frequency of 15 kHz under pulse band width changing from 30% to 100% of pulse width, and of the frequency of double of 7.5 kHz, the period of 15 kHz by two times and of the frequency of double of 5 kHz, the period of 15 kHz by three times under pulse band width less than 30% of pulse width.

As a result, it was confirmed that it prevented the efficiency of power converter from decreasing, and it can provide the high efficiency of DC/DC power converter from low to high output.

Further, in the embodiments of DC/DC power converter, it may make a noise in a quiet place in the operating period set to be three times (for example, the frequency from 5 kHz to 15 kHz as shown in FIG. 4) to prevent the efficiency in low output from decreasing using transistors, MOS transistors, thyristors used in prior DC/DC power converter.

As a response to this, the usage of SiC switching device as higher frequency possible switching device makes no sound to be heard and prevents the efficiency in low output from decreasing, when the reference operating frequency ω0 is set to be, for example, 100 kHz, and the reference operating frequency is decreased and the operating period is set to be three times of previous period (the frequency is 33 kHz). The inventors of this application confirmed the above as the experiment results.

Figure 3:
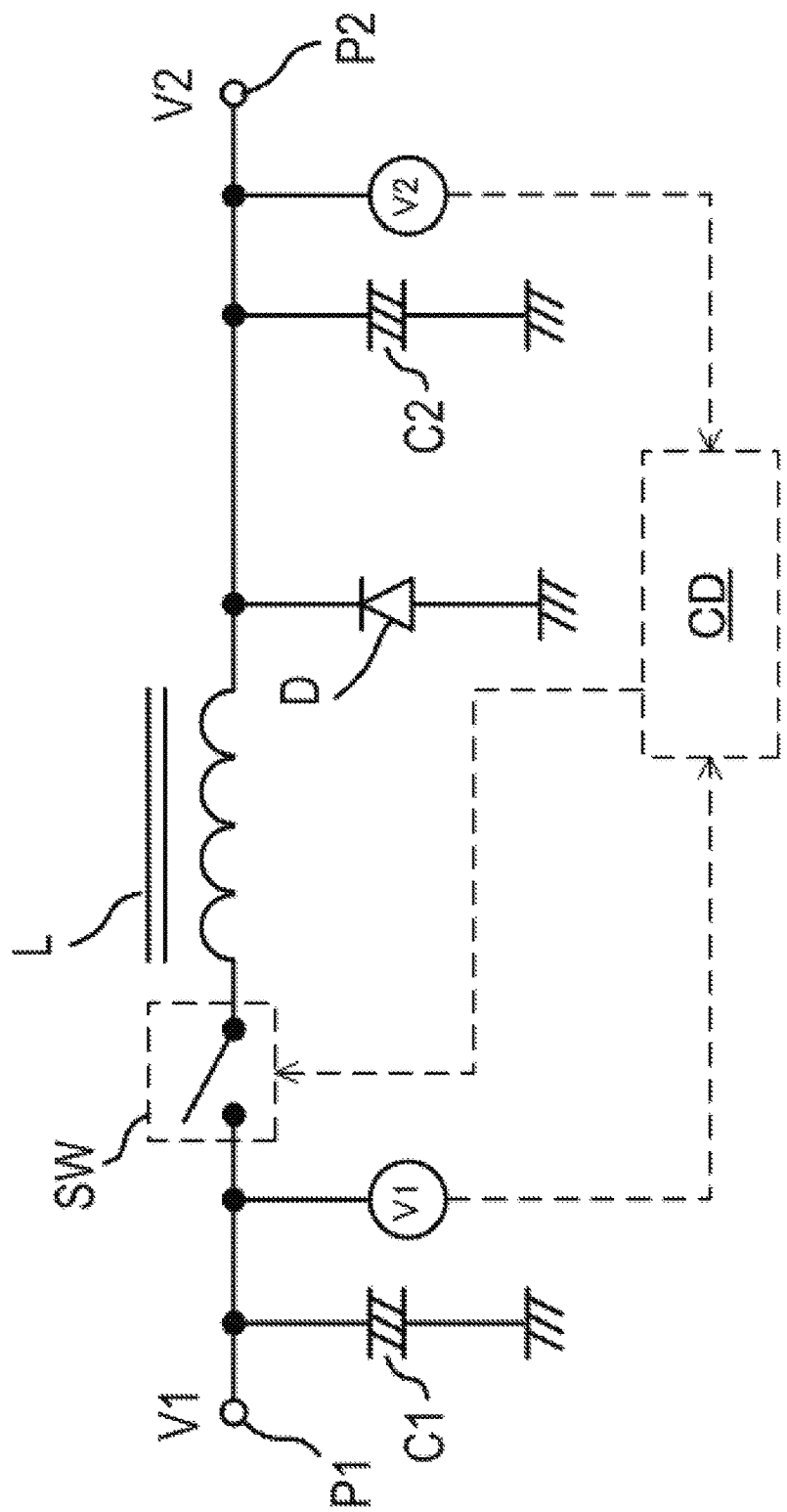
FIG. 3 illustrates a diagram of direct current to direct current power converter according to the embodiment of the invention.
Figure 6:
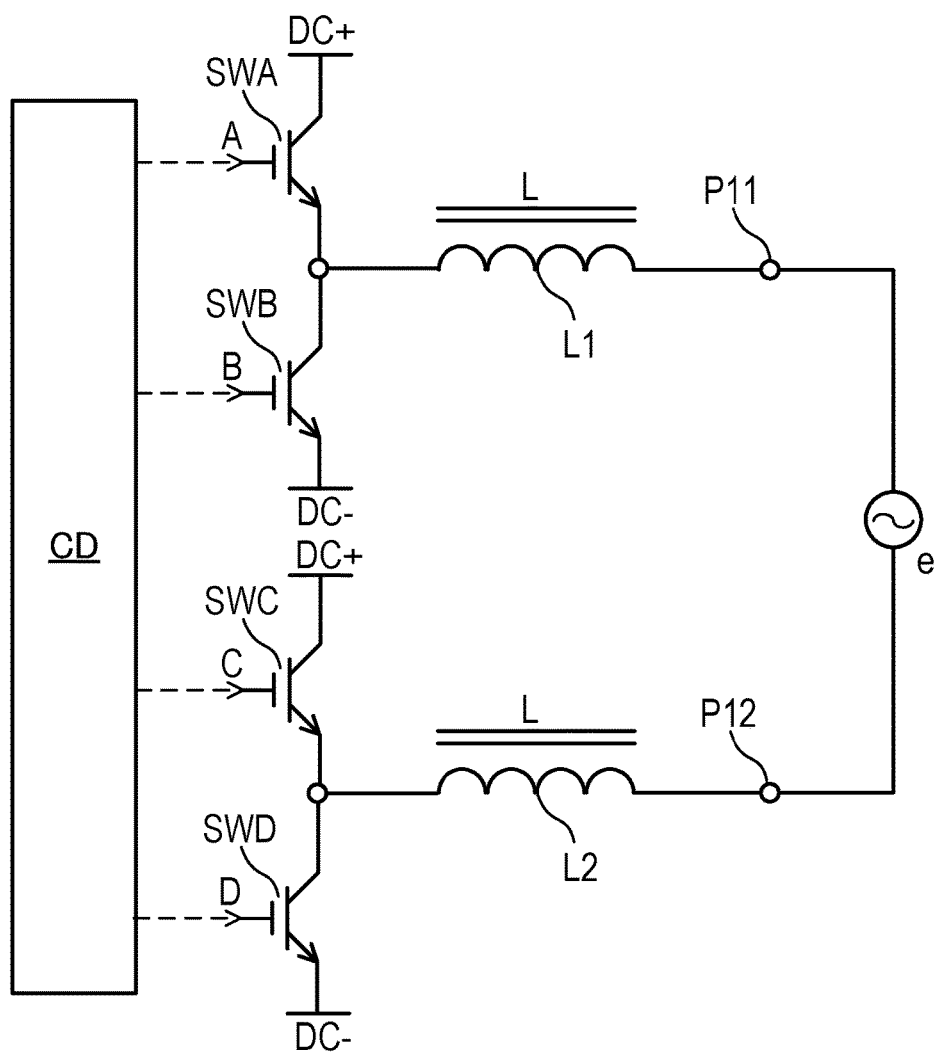
FIG. 6 illustrates a diagram of direct current to direct current power converter according to another embodiment of the invention.

The DC/DC power converters were explained as the embodiments shown in FIGS. 1 and 3. However, the embodiments are not limited to the explained embodiments, the power converters in the embodiments can applied to DC/AC power converter (Direct Current/Alternating Current power converter), AC/DC power converter (Alternating Current/Direct Current power converter). As an example, the DC/AC power converter as shown in FIG. 6 can be explained.

The DC/DC power converter includes switching elements SWA, SWB connected in series between DC power sources DC+, DC−, a reactor L1 that connects through electric contact between the connecting point of the switching elements SWA, SWB and the output terminal P11, the switching elements SWC, SWD connected in series between DC power sources DC+, DC−, a reactor L2 that connects through electric contact between the connecting point of the switching elements SWC, SWD and the output terminal P12, a control unit that inputs control signals to the switching elements SWA, SWB,SWC, SWD, respectively.

Figure 7:
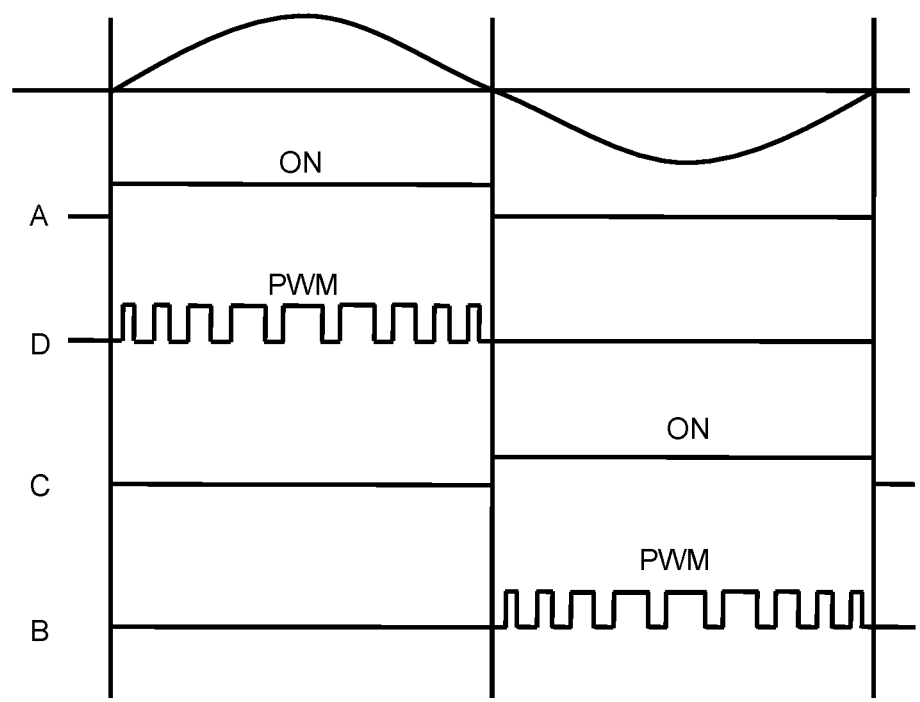
FIG. 7 illustrates a timing chart of control signal in the power conversion operation of direct current to direct current power converter according to another embodiment of the invention.

The DC/DC power converter converts DC to AC as illustrated in FIG. 7, by generating signal A as ON pulse signal at positive cycle of AC signal and OFF pulse signal at negative cycle of AC signal, generating signal C as OFF pulse signal at positive cycle of AC signal and ON pulse signal at negative cycle of AC signal, generating signal D as a PWM signal with a pulse width depending on the output level of alternating current signal at ON pulse signal of signal A, and generating signal B as a PWM signal with a pulse width depending on the output level of alternating current signal at ON pulse signal of signal C.

At the positive cycle of signal A, the signal A switches ON the switching element SWA, and the signal D depending on the PWM signal switches ON the switching element SWD. By the switching, the switching element SWA, the reactor L1, the reactor L2, and the switching element SWD connect electrically, and the positive half cycle of alternating current voltage is outputted.

Next, at OFF cycle of signal A, the signal C switches ON the switching element SWC, and the signal B depending on the PWM signal switches ON the switching element SWB. By the switching, the switching element SWC, the reactor L1, the reactor L2, and the switching element SWB connect electrically, and the negative half cycle of alternating current voltage is outputted.

Figure 8:
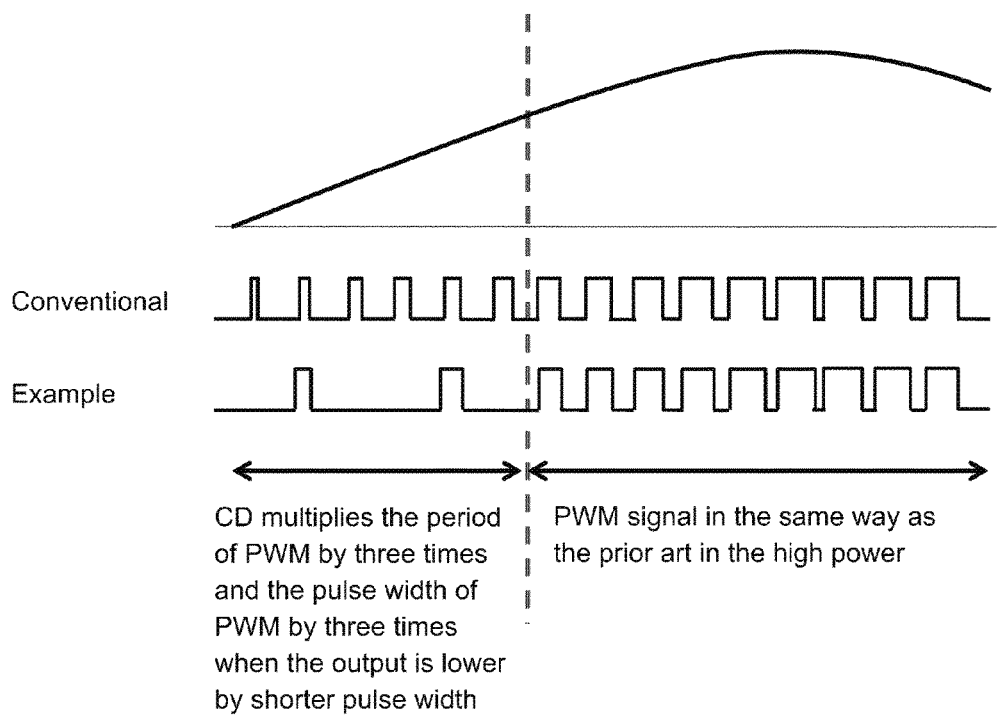
FIG. 8 illustrates a timing chart in which the pulse width of PWM and the period of PWM by N times when the pulse width of direct current to direct current power converter is narrowed according to another embodiment of the invention.

The above operation can convert the direct current power to the alternating current power using the PWM signal in the same way as the prior art. However, the efficiency of the power converter in the PWM signal in the lower output portion is low, as illustrated in FIG. 8.

To solve the above problem, according to the DC/AC power converter the control unit CD multiplies the period of PWM by three times and the pulse width of PWM by three times when the output is lower by shorter pulse width. Thereby, the DC/AC power converter same as the DC/DC power converter do not cause the efficiency power converter lower from the high load power to low load power.

Next, the AC/DC power converter according to another embodiment is configured to include the circuits same to the DC/AC power converter illustrated in FIG. 6, and described herewith. The AC/DC power converter has the opposite input/output against DC/AC power converter illustrated in FIG. 6, and includes a reactor L1 that connects through electric contact between the connecting point of the switching elements SWA, SWB connected in series between DC power sources DC+, DC−, and connected to the terminals P1 and P2 with the input alternating current power source e as an input alternating current power source e; the switching elements SWC, SWD connected in series between DC power sources DC+, DC−; a reactor L2 that connects through electric contact between the connecting point of the switching elements SWC, SWD and the output terminal P2 of the other end of the input alternating current power source e; a control unit CD that inputs control signals to the switching elements SWA, SWB, SWC, SWD, respectively.

Figure 9:
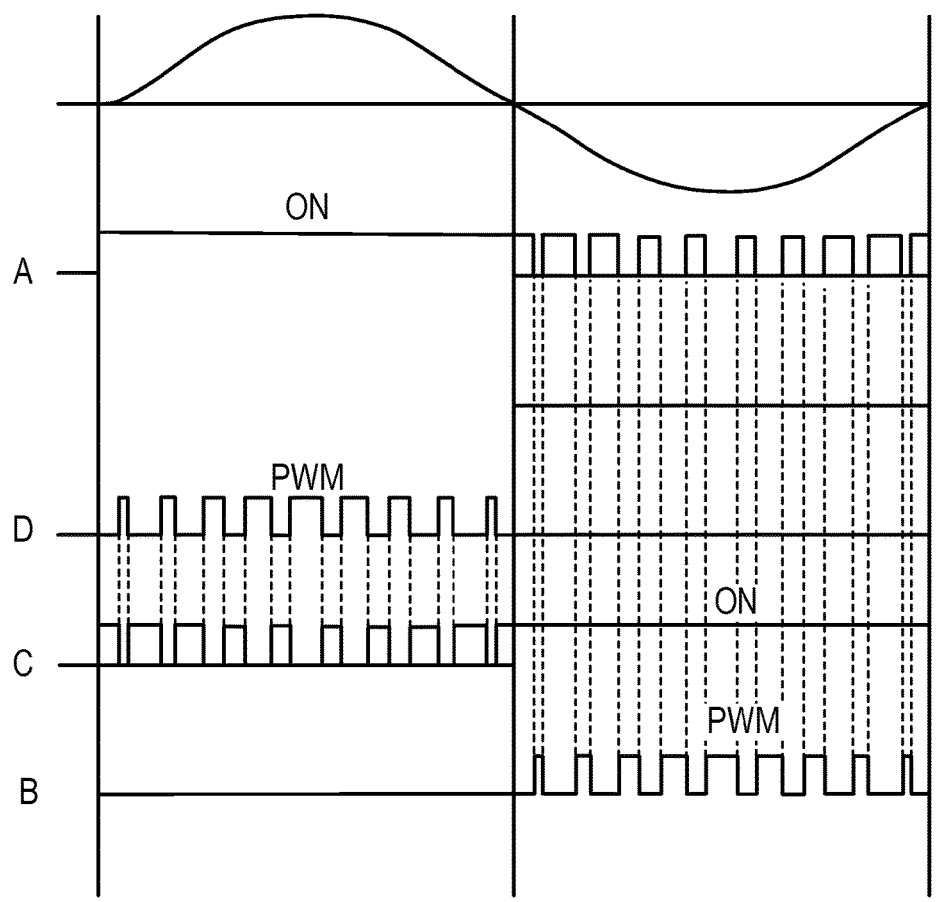
FIG. 9 illustrates the timing chart in which the pulse width of PWM and the period of PWM are multiplied by N times when the pulse width of direct current to direct current power converter is narrowed according to other embodiment of the invention.

The AC/DC power converter converts DC to AC as illustrated in FIG. 9, at positive cycle of input AC signal e, by generating signal A as ON pulse signal, generating signal D as a PWM signal with a pulse width depending on the output level of alternating current signal at ON pulse signal of the AC signal, generating signal C as a PWM pulse signal of the invesion of signal D. At the negative cycle of input AC signal e, the signal C is ON signal, the input D is OFF signal, the signal B is the pulse width signal depending on the level of AC signal and the signal A is the pulse signal of invesion of PWM waveform of signal B.

At the negative cycle of input AC signal e and the positive half cycle of signal A, the signal A switches ON the switching element SWA, and the direct current power is outputted by the switching elements SWA, SWB depending on the waveform of PWM signal of signal D through the reactors L1 and L2.

Next, At the negative cycle of input AC signal e and the OFF half cycle of signal D, the switching element SWC is ON, the switching elements SWC, SWB depending on the input alternating current source e outputs the direct current power through the reactors L1, L2.

The AC/DC power converter can convert the alternating current power to the direct current power using the PWM signal, in the same way as the prior art. However, the efficiency of the power converter in the PWM signal in the lower output portion is low, as illustrated in FIG. 9, in the same way as the prior art.

To solve the above problem, according to the AC/AC power converter the control unit CD multiplies the period of PWM by three times and the pulse width of PWM by three times when the output is lower by shorter pulse width. Thereby, the AC/DC power converter same as the DC/DC power converter does not cause the efficiency power converter lowering from the high load power to low load power.

DESCRIPTION OF THE REFERENCE NUMERALS

P1 Input terminal
P2 Output terminal
V1 Input voltage
V2 Output voltage
V1m Input voltage meter
V2m Output voltage meter
C1 Input side capacitor
C2 Output side capacitor
L, L1, L2 Reactor
D Diode
SW Switch
P11, P12 Output terminal (Input terminal)
SWA, SWAB, SWC, SWD Switching element
CD Control Unit

What is claimed is:
1. An electric power converter comprising:
a first capacitor being located between an input terminal and an output terminal, and that connects a first terminal being located between the input terminal and a ground;
a reactor that connects through electric contact between the first terminal and the output terminal;
a switching element that connects through electric contact between the input terminal and the output terminal;
a control unit that executes a first PWM (Pulse Width Modulation) control process controlling a pulse width of a PWM waveform by on and off of the switching element according to the fluctuation of an output voltage, and that executes a second PWM control process widening a pulse width of a PWM and a duty cycle of the PWM than those of previous cycle when the pulse width becomes a lower limit;
wherein the control unit multiplies the pulse width of the PWM and a period of the PWM by N (N means plus quantity greater than one) times.
2. The electric power converter according to claim 1, wherein:
the reactor is connected to the input terminal at one end;
the switching element is connected to the other terminal of the reactor at one end;
the switching element is connected to a ground at other end;
the electric power converter comprising:
a rectifying element that connects through electric contact between other end of the reactor and the output terminal; and a second capacitor that connects through one end between the output terminal and the rectifying element and that connects through the other end to a ground.

3. The electric power converter according to claim 1, comprising:
a rectifying element; and
a second capacitor that connects through one end between the output terminal and the reactor and that connects through other end to a ground;
wherein the switching element connects to through electric contact between the input terminal and one end of the reactor; and
the rectifying element connects through one end to the reactor and through other end to a ground.

4. The electric power converter according to claim 1, wherein the switching element includes a silicon carbide (SiC) element.

5. The electric power converter according to claim 1, wherein the switching element includes a silicon carbide (SiC) element.

6. An electric power converter comprising:
a DC power source;
a first circuit that includes first and second switching elements being connected in series, and connects the DC power source;
a second circuit that includes third and fourth switching elements being connected in series, and connects the DC power source;
a first reactor that connects through electric contact between a connecting mid-point of the first circuit and an output terminal of the first circuit;
a second reactor that connects through electric contact between a connecting mid-point of the second circuit and an output terminal of the second circuit;
a control unit that executes a first PWM (Pulse Width Modulation) control process alternately turning on the half cycle of alternating signal to be outputted to the first switching element and the third switching element, and controlling a PWM pulse wave in a PWM wave of the second switching element and the fourth switching element, and that executes a second PWM control process widening a pulse width of a PWM and widening a period of the PWM than those of previous cycle when the pulse width becomes a lower limit; and
wherein the control unit multiplies the pulse width of the PWM and the period of the PWM by N (N means plus quantity greater than one) times.

7. A power amplifier comprising:
a first and second AC power source input terminal that AC power source is inputted;
a first circuit that includes first and second switching elements being connected in series, and connects the DC power source;
a second circuit that includes third and fourth switching elements being connected in series, and connects the DC power source;
a first reactor that connects through electric contact between a connecting mid-point of the first circuit and the first AC power source input terminal;
a second reactor that connects through electric contact between a connecting mid-point of the second circuit and the second AC power source input terminal;
a control unit that executes a first PWM (Pulse Width Modulation) control process alternately turning on the half cycle of alternating signal to be outputted to the first switching element and the third switching element, and controlling a PWM pulse wave in a PWM wave of the second switching element and the fourth switching element, and that executes a second PWM control process widening a pulse width of a PWM and widening the period of the PWM than those of previous cycle when the pulse width becomes a lower limit; and
wherein the control unit multiplies the pulse width of the PWM and the period of the PWM by N (N means plus quantity greater than one) times.

* * * * *